United States Patent
Harris et al.

(10) Patent No.: US 7,074,493 B1
(45) Date of Patent: Jul. 11, 2006

(54) POLYIMIDES USED AS MICROELECTRONIC COATINGS

(75) Inventors: Frank W. Harris, Akron, OH (US); Stephen Z. D. Cheng, Hudson, OH (US)

(73) Assignee: The University of Akron, Akron, OH (US)

( * ) Notice: Subject to any disclaimer, the term of this patent is extended or adjusted under 35 U.S.C. 154(b) by 0 days.

(21) Appl. No.: 09/890,378

(22) PCT Filed: Jan. 28, 2000

(86) PCT No.: PCT/US00/02281

§ 371 (c)(1), (2), (4) Date: Jan. 10, 2002

(87) PCT Pub. No.: WO00/45435

PCT Pub. Date: Aug. 3, 2000

Related U.S. Application Data

(60) Provisional application No. 60/117,960, filed on Jan. 29, 1999.

(51) Int. Cl.
*B32B 27/00* (2006.01)

(52) U.S. Cl. .................... 428/473.5; 428/901

(58) Field of Classification Search ............ 428/473.5, 428/901
See application file for complete search history.

(56) References Cited

U.S. PATENT DOCUMENTS

| | | | |
|---|---|---|---|
| 4,239,880 A | 12/1980 | Darms | 528/125 |
| 4,485,140 A | 11/1984 | Gannett et al. | 428/260 |
| 4,499,149 A | 2/1985 | Berger | 428/447 |
| 5,175,242 A | 12/1992 | Harris | 528/353 |
| 5,324,813 A * | 6/1994 | Hougham et al. | 528/353 |
| 5,391,915 A * | 2/1995 | Mukai et al. | 257/643 |
| 5,480,964 A * | 1/1996 | Harris et al. | 528/353 |
| 5,677,041 A | 10/1997 | Smayling | 428/209 |
| 5,766,740 A | 6/1998 | Olson | 428/209 |
| 5,814,894 A | 9/1998 | Igarashi et al. | 257/787 |
| 6,080,640 A * | 6/2000 | Gardner et al. | 438/455 |
| 6,229,949 B1 * | 5/2001 | Ido et al. | 385/145 |

FOREIGN PATENT DOCUMENTS

WO WO98/37445 * 8/1998

OTHER PUBLICATIONS

"N,N-Dimethylacetamide", Chemfinder.com, printed Mar. 11, 2004.*
"1-Methyl-2-pyrrolidinone", Chemfinder.com, printed Mar. 11, 2004.*

* cited by examiner

*Primary Examiner*—Melanie Bissett
(74) *Attorney, Agent, or Firm*—Roetzel & Andress, LPA; George W. Moxon, II

(57) ABSTRACT

New polynuclear aromatic diamines, such as 2,2'-di-(p-aminophenoxy)-biphenyl, a process for their manufacture and their use as polycondensation components for the manufacture of polyamide, polyamide-imide and polyimide polymers are described. The polymers obtained with the aromatic diamines according to the invention are readily soluble and can also be processed from the melt and are distinguished by good thermal, electrical and/or mechanical properties.

18 Claims, No Drawings

POLYIMIDES USED AS MICROELECTRONIC COATINGS

This application claims the benefit of Provisional Application No. 60/117,960, filed Jan. 29, 1999.

TECHNICAL FIELD OF THE INVENTION

The present invention is directed to polyimides having very low dielectric constants, low coefficients of thermal expansion, improved thermal stability and excellent solubility in conventional organic solvents. More particularly, the present invention is directed to a method of coating microelectronic aparatii, components, parts and elements with a polyimide film, the polyimide film comprising the polymerization product of a fixed aromatic diamine or fixed aromatic dianhydride having a fluorine-containing substituent and a 2,2'-disubstituted dianhydride and 2,2'-disubstituted diamine, respectively. The polyimides of the present invention are easily processed in many conventional organic solvents and may be cast into thin films that are suited for coatings in the microelectronics industry.

BACKGROUND OF THE INVENTION

Polyimides are useful as components that require excellent thermal, electrical and/or mechanical properties. For general discussion of polyimide preparation, characterization and applications, one can refer to *Polyimides, Synthesis, Characterization and Applications*, L. Mittal, ed Plenum, N.Y. 1984.

Polyimides based on pyromellitic dianhydride and various organic diamines are disclosed in U.S. Pat. No. 4,485,140 to Gannett et al. Polyimides based on diamines such as 2,2'-di-(p-aminophenyloxy)-diphenyl and various dianhydrides are disclosed in U.S. Pat. No. 4,239,880 to Darms. Harris et al., in U.S. Pat. No. 5,175,242, has disclosed the preparation of soluble polyimides based on 3,6-diarylpryomellitic dianhydride and various diamines including the diamines of the present invention.

Aromatic polyimides are synthesized by the polymerization of an aromatic dianhydride with an aromatic diamine. The presence of the aromatic and imide rings in the polyimide chemical repeating units result in an aromatic polyimide possessing chain rigidity and linearity. The aromatic polyimide structures possess high thermal stability, outstanding mechanical properties and excellent chemical resistance.

Most aromatic polyimides, however, are insoluble in conventional solvents and processing is difficult. The insolubility of polyimides originates from their high aromaticity, their rigid imide structure in the polymer backbone, as well as the formation of the inter and intramolecular charge transfer complexes and the ordered structures resulting form chain packing of the molecules.

The polyimides derived from the above cited references lack consistency in satisfactory properties to be used as high clarity, low dielectric constant coating materials or as high compression strength fibers or fabrics. Therefore, is it desirable to develop polyimides that have lower dielectric constants, higher coefficients of thermal expansion, good thermal stability and that are soluble in conventional organic solvents, thus allowing processing in the imide form to avoid many problems associated with handling poly(amic) acid precursors.

SUMMARY OF THE INVENTION

It is therefore an object of the present invention to provide polyimide coatings having excellent solubility in conventional organic solvents.

It is a further object of the present invention to provide polyimide coatings having a low dielectric constant.

It is a further object of the present invention to provide polyimide coatings having high coefficients of thermal expansion.

It is a further object of the present invention to provide polyimide coatings having excellent thermal stability.

The present invention therefore provides an integrated circuit comprising an integrated circuit and an insulating layer disposed on said integrated circuit, wherein said insulating layer is a polyimide film that is the polymerization product of an aromatic diamine having the general formula (I):

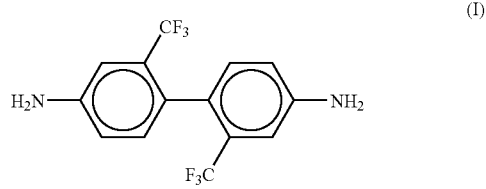

and an aromatic dianhydride having the formula (II):

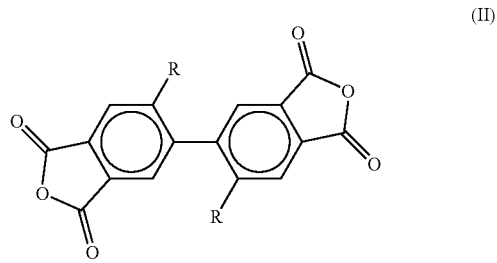

wherein R is an organic substituent selected from the group consisting of CF$_3$, o-trifluoromethyl phenyl, m-trifluoromethyl phenyl, p-trifluoromethyl phenyl and 3,5-bis [(m-trifluoromethyl) phenyl]; or the polymerization product of an aromatic dianhydride having the general formula (III):

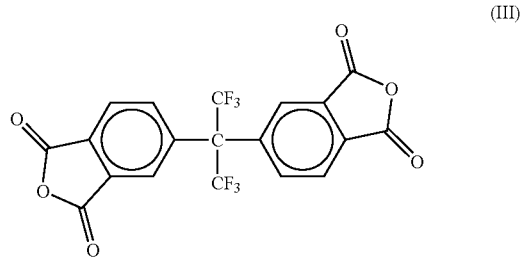

and an aromatic diamine having the formula (IV):

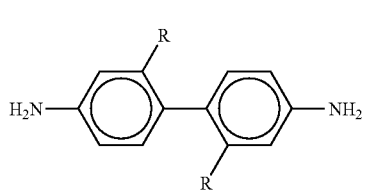

wherein R is a substituent selected from the group consisting of trifluoromethyl, o-trifluoromethyl phenyl, m-trifluoromethyl phenyl, p-trifluoromethyl phenyl and 3,5'-bis[(m-trifluoromethyl) phenyl].

The present invention further provides an insulated electrically conductive component comprising an electrically conductive component; and an insulating layer that is the polymerization product of an aromatic diamine having the general formula (I):

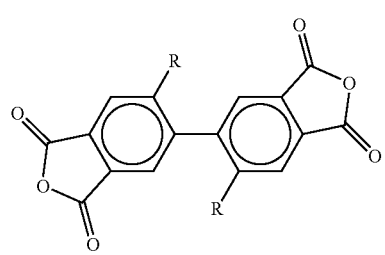

and an aromatic dianhydride having the formula (II):

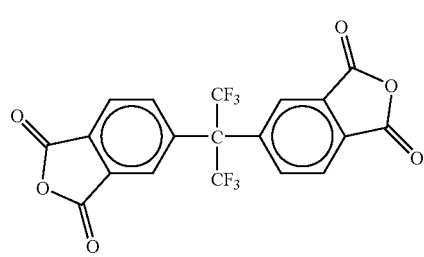

wherein R is an organic substituent selected from the group consisting of $CF_3$, o-trifluoromethyl phenyl, m-trifluoromethyl phenyl, p-trifluoromethyl phenyl and 3,5-bis[(m-trifluoromethyl) phenyl]; or the polymerization product of an aromatic dianhydride having the general formula (III):

and an aromatic diamine having the formula (IV):

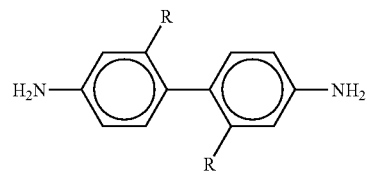

wherein R is a substituent selected from the group consisting of trifluoromethyl, o-trifluoromethyl phenyl, m-trifluoromethyl phenyl, p-trifluoromethyl phenyl and 3,5'-bis[(m-trifluoromethyl) phenyl].

The present invention further provides a method of coating an integrated circuit comprising the steps of preparing a polyimide comprising the polymerization product of an aromatic diamine having the general formula (I):

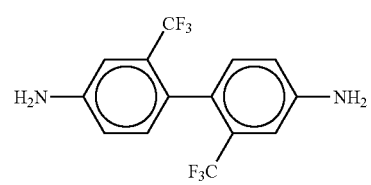

and an aromatic dianhydride having the formula (II):

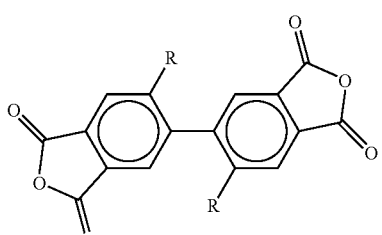

wherein R is an organic substituent selected from the group consisting of $CF_3$, o-trifluoromethyl phenyl, m-trifluoromethyl phenyl, p-trifluoromethyl phenyl and 3,5-bis[(m-trifluoromethyl) phenyl]; or the polymerization product of an aromatic dianhydride having the general formula (III):

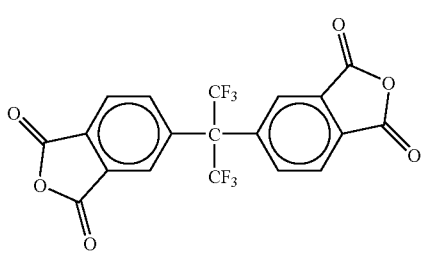

and an aromatic diamine having the formula (IV):

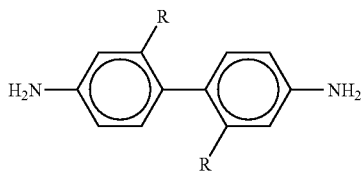

wherein R is a substituent selected from the group consisting of trifluoromethyl, o-trifluoromethyl phenyl, m-trifluoromethyl phenyl, p-trifluoromethyl phenyl and 3,5'-bis[(m-trifluoromethyl) phenyl]; applying the polyimide dispersed within the organic solvent to the surface of the integrated circuit forming a thin insulating layer or film on the surface of the circuit; and heating the integrated circuit with the insulating polyimide layer or film disposed thereon to a temperature sufficient to evaporate the organic solvent and to cure the polyimide.

DETAILED DESCRIPTION OF THE INVENTION

It has now been discovered that the use of certain polyimides that are useful for insulating electronic and microelectronic components gives rise to unexpectedly superior properties. Namely, the polyimides used in this invention have been found to exhibit superior dielectric constants, coefficients of thermal expansion, and thermal stability, even when compared to similar polyimide compounds. Additionally, the polyimides used in this invention are advantageously soluble in common organic solvents and, therefore, are easily processed and used for insulating electronic and microelectronic components.

The polyimides used in this invention are selected from the group of polyimides that are the polymerization product of polymerization product of an aromatic diamine having the general formula (I):

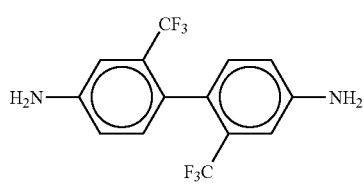

and an aromatic dianhydride having the formula (II):

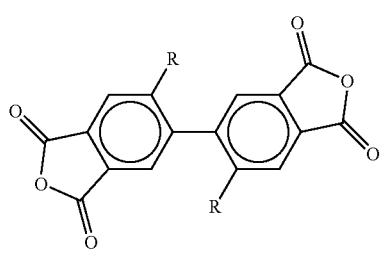

wherein R is an organic substituent selected from the group consisting of $CF_3$, o-trifluoromethyl phenyl, m-trifluoromethyl phenyl, p-trifluoromethyl phenyl and 3,5-bis[(m-trifluoromethyl) phenyl].

Also, the polyimides used in this invention are selected from the group of polyimides that are the polymerization product of an aromatic dianhydride having the general formula (III):

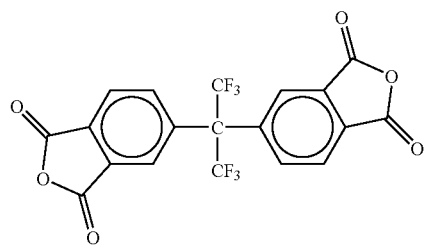

and an aromatic diamine having the formula (IV):

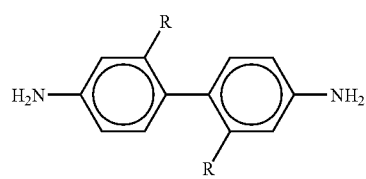

wherein R is a substituent selected from the group consisting of trifluoromethyl, o-trifluoromethyl phenyl, m-trifluoromethyl phenyl, p-trifluoromethyl phenyl and 3,5'-bis[(m-trifluoromethyl) phenyl]. It has now been found that modifications of the dianhydride and diamine monomers to include fluorine-containing substituents results in a polyimide film useful for coating microelectronic components, parts, elements, connectors and aparatii, having very low dielectric constants, improved coefficients of thermal expansion (CTE), improved thermal stability and excellent solubility in many common organic solvents.

The foregoing polyimides can be prepared in accordance with the techniques and teachings of U.S. Pat. Nos. 5,395,918 and 5,071,997, and therefore both of these patents are incorporated herein by reference.

Notably, the polyimides used in this invention can be polymerized by using a one step polymerization method. This ability makes the polyimides employed in this invention extremely useful as coatings, layers or films for electronic or microelectronic applications.

The prior art coating methods involve a three step process including coating a microelectronic components, usually computer chips, with a poly(amic) acid precursor coating material, heating the poly(amic) acid precursor coating material to a temperature sufficient to burn off the excess organic solvent followed by a second heating step to cure the poly(amic) acid prescursor into a polyimide. The coating method of the present invention is an improvement over the prior art in that the polyimide is highly soluble in most common organic solvents and, therefore, a solution containing the polyimide may be coated on the components in one step, without the steps further curing the poly(amic) acid precursors into polyimides.

As described above, is it desirable to develop polyimides that are soluble in common organic solvents to allow processing in the imide form in order to avoid many problems associates with handling poly(amic) acid precursors. This is especially important in microelectronic coating applications, where the imidization conditions for PAAs used during processing can dramatically affect their ultimate material properties.

The present invention is an improvement over the prior art methods of coating microelectronic components in that the polyimides disclosed exhibit excellent solubility in many common organic solvents without substantially decreasing the rigidity of the polyimide backbone structure. This is especially important for applications where the imidization condition of poly(amic) acid precursors can dramatically effect structure, morphology and final material properties. Maintaining the polyimide backbone structure minimizes reduction in thermal and mechanical properties. The polyimides used in the present invention are soluble in most common organic solvents including, but not limited to, acetone, cyclopentanone, tetrahydrofuran (THF), N,N'-dimethylacetamide (DMAc), N,N'-dimethylformamide (DMF), N-methylpyrrolidone (NMP), p-chlorophenol and m-cresol.

The polyimide coatings of the present invention are soluble in many common nontoxic solvents and can be readily cast into flexible, tough films having low dielectric constants, high coefficients of thermal expansion and high thermal stability. A one step polymerization method has been previously developed for organo-soluble aromatic polyimides. In this procedure, the dianhydride and diamine are dissolved and stirred at 180–200° C. in refluxing high boiling m-cresol or p-chlorophenol. The water generated by the imidization is usually distilled off from the reaction mixture. Although the formation of the polyimide is most likely to proceed via poly(amic) acid precursors, these precursors are only present as extremely short-lived intermediates. Imidization occurs simultaneously with the chain propagation reaction or shortly thereafter. Therefore, the one step imidization process of the present invention avoids the uncontrollable structure, morphology and properties associated with the two-step polymerization route.

As described above, polyimides of the present invention be used as coating or films for various microelectronic components and may be integrated with other electronic components acting as an interlayer dielectric in integrated circuits. In evaluating the usefulness of polyimides as dielectric coatings, layers and films, physical properties of polyimides, namely the dielectric constant ($\epsilon$), the coefficient of thermal expansion (CTE), thermal stability, and solubility must be evaluated.

In fact, the polyimides used in this invention have been found to exhibit a dielectric constant that is less than 2.8, advantageously less than 2.7, and even more advantageously less than 2.5. Further, the polyimides used in this invention have been found to exhibit a coefficient of thermal expansion that is greater than about $23 \times 10^{-6}$/° C., advantageously greater than about $42 \times 10^{-6}$/° C., and most advantageously greater than about $54 \times 10^{-6}$/° C.

In one embodiment, the present invention is directed toward an integrated circuit that includes at least one insulating layer that is formed from the polyimides defined hereinabove. These polyimide layers of films have a thickness of between about 10 and about 1000 microns, preferably about 10 to about 500 microns and most preferably about 10 to about 100 microns. Microelectronic computer chips are well known in the art and the selection of any one specific electronic configuration should not limit the scope of the present invention. For a detailed discussion of the design, manufacture and electrical, thermal and mechanical properties of microelectronic computer chips and related electronic or microelectronic circuits, one can refer to *Electronic Materials Handbook, Volume* 1. ASM International, (1989), which is incorporated herein by reference.

In one embodiment of the present invention, the polyimides used are the polymerization product of a fixed fluorine substituent-containing dianhydride, namely 2,2'-bis(3,4-dicarboxyphenyl)hexafluoropropane dianhydride (6FDA) and one of a series of 4,4'-diamino-2,2'-disubstituted biphenyls. The 4,4'-diamino-2,2'-disubstituted biphenyls are selected from the group consisting of 4,4'-diamino-2,2'-bis(trifluoromethyl)biphenyl (PFMB), 4,4'-diamino-2,2'-bis(p-trifluorometheylphenyl)-biphenyl (P6FDPBZ), 4,4'-diamino-2,2'-bis(o-trifluoromethylphenyl)-biphenyl (O6FDPBZ), 4,4'-diamino-2,2'-bis(m-trifluoromethylphenyl) biphenyl (M6FDPBZ) and 4,4'-diamino-2,2'bis[3,5-bis(trifluoromethyl)phenyl] biphenyl (M12FDPBZ).

In another embodiment of the present invention, is the polymerization product of a fixed fluorine-containing substituent diamine, namely 4,4'-diamino-2,2'-bis(trifluoromethyl) biphenyl (PFMB) and one of a series of 2,2'-disubstituted-4,4',5,5'-biphenyltetracarboxylic dianhydrides. The 2,2'-disubstituted-4,4',5,5'-biphenyltetracarboxylic dianhydrides are selected from the group consisting of 2,2'-bis(trifluoromethyl)-4,4',5,5'-biphenyltetracarboxylic dianhydride (HFBPDA), 2,2'-bis[o-(trifluoromethyl)phenyl]-4,4',5,5'-biphenyltetracarboxylic dianhydride (O6FDPBPDA), 2,2'-bis[m-(trifluoromethyl)phenyl]-4,4',5,5'-biphenyltetracarboxylic dianhydride (M6FDPBPDA), 2,2'-bis[p-(trifluoromethyl)phenyl]-4,4',5,5'-biphenyltetracarboxylic dianhydride (P6FDPBPDA) and 2,2'-bis[3,5-bis(trifluoromethyl)phenyl]-4,4',5,5'-biphenyltetracarboxylic dianhydride (M12FDPBPDA).

In another embodiment, the present invention is directed to an electrically conductive component including-an insulating polyimide film or layer, the polyimide film or layer being prepared as discussed hereinabove.

In another embodiment, the present invention also provides a method of coating an integrated circuit comprising preparing a polyimide film, the polyimide film being prepared as described hereinabove; applying the polyimide to the surface of the integrated circuit forming a thin insulating layer or film on the surface of the integrated circuit; and heating the integrated circuit having the polyimide film disposed thereon to a temperature sufficient to evaporated the excess organic solvent and to cure the polyimide.

Methods of applying the polyimide to the integrated circuit include, but are not limited to, spraying, dipping, spin-coating, brush-coating and flow-coating.

GENERAL EXPERIMENTAL

Preparation of Polyimides

As described above, 6FDA-based, PFMB-based and DMB-based polyimides were synthesized according to the methods disclosed by Harris et al., U.S. Pat. Nos. 5,395,918 and 5,071,997, the entire disclosure of each patent incorporated herein by reference. Acetone, chloroform, and tetrahydrofuran were purchased from Fisher Scientific Co. 2-Pentanone, cyclopetanone, cyclohexanone, methyl ethyl ketone (MEK), γ-butyrolactone, propylene glycol methyl ether acetate (PGMEA), N,N'-dimethylacetamide (DMAc), N,N'-dimethylformamide (DMF), dimethylsulfoxide (DMSO), N-methylpyrrolidone (NMP) and m-cresol were purchased from Aldrich Chemical Company. DMSO, NMP, DMAc and m-cresol were distilled under reduced pressure prior to use.

The dielectric constants for 6FDA-based polyimide films was determined using ASTM-150 method at 1 MHz on 6FDA-based polyimide films having a thickness of 10 to 40 microns. The dielectric constants were determined for 6FDA-based polyimide films comprising the polymerization product of 6FDA and 4,4'-diamino-2,2'-dichlorobiphenyl (6FDA-DCB, comparative), 4,4'-diamino-2,2'-dibromobiphenyl (6FDA-DBB, comparative), 4,4'-diamino-2,2'-diiodobiphenyl (6FDA-DIB, comparative), 4,4'-diamino-2,2'-dimethylbiphenyl (6FDA-DMB, comparative), 4,4'-diamino-2,2'-dicyanobiphenyl (6FDA-DCN, comparative), 4,4'-diamino-2,2'-bis(p-methylphenyl)biphenyl (6FDA-MP-PBZ, comparative), 4,4'-diamino-2,2'-bis(4-phenylphenyl) biphenyl (6FDA-3PBZ, coparative), 4,4'-diamino-2,2'-bis (trifluoromethyl)biphenyl (6FDA-PFMB), 4,4'-diamino-2,2'-bis(p-trifluorometheylphenyl)-biphenyl (6FDA-P6FDPBZ), 4,4'-diamino-2,2'-bis(o-trifluoromethylphenyl)-biphenyl (6FDA-O6FDPBZ), 4,4'-diamino-2,2'-bis(m-trifluoromethylphenyl) biphenyl (6FDA-M6FDPBZ) and 4,4'-diamino-2,2'-bis[3,5-bis(trifluoromethyl)phenyl] biphenyl (6FDA-M12FDPBZ). The results of the dielectric experiments for 6FDA-based polyimides are shown in Table I, below.

TABLE I

Dielectric Constants of 6FDA-based aromatic polyimide films at MHz and GHz frequency regions

| Diamines | 2,2'-Disubstituted Groups | $\epsilon = n^2$ | $\epsilon^a$ | F % |
|---|---|---|---|---|
| DCB | —Cl | 2.55 | | |
| DMB | —CH$_3$ | 2.50 | | |
| DCN | —CN | 2.57 | | |
| DBB | —Br | 2.57 | | |
| DIB | —I | 2.63 | | |
| PFMB | —CF$_3$ | 2.38 | 2.53 | 34.3 |
| O6FDPBZ | (o-CF$_3$-phenyl) | 2.44 | 2.74 | 25.9 |
| M6FDPBZ | (m-CF$_3$-phenyl) | 2.46 | 2.78 | 25.9 |
| P6FDPBZ | (p-CF$_3$-phenyl) | 2.43 | 2.67 | 25.9 |
| M12FDPBZ | (3,5-bis(CF$_3$)phenyl) | 2.34 | 2.49 | 33.7 |

As shown in Table I, above, the dielectric constants for 6FDA-based polyimide films comprising the polymerization product of 6FDA and a 4,4'-diamino-2,2'-disubstituted biphenyl selected from one of 4,4'-diamino-2,2'-bis(trifluoromethyl)biphenyl (PFMB), 4,4'-diamino-2,2'-bis(p-trifluorometheylphenyl)-biphenyl (P6FDPBZ), 4,4'-diamino-2,2'-bis(o-trifluoromethylphenyl)-biphenyl (O6FDPBZ), 4,4'-diamino-2,2'-bis(m-trifluoromethylphenyl) biphenyl (M6FDPBZ) and 4,4'-diamino-2,2'bis[3,5-bis(trifluoromethyl)phenyl] biphenyl (M12FDPBZ) that are less than about 2.8.

The thermal expansion and glass transition temperatures for 6FDA-based polyimide films was determined by using the Thermal Mechanical Analysis (TMA) and Differential Scanning Calorimetry (DSC) methods. The coefficient of thermal expansion (CTE) and glass transition temperatures (Tg) for the 6FDA-based polyimide films are shown in Table II, below.

The glass transition temperatures (Tg) of the 6FDA-based polyimide films of the present invention were evaluated by Differential Scanning Calorimetry (DSC), using heating rate of 10° C./minute. Prior to any measurements, the polyimide film samples were heated to 390° C., held for 5 minutes, and subsequently cooled to room temperature at a rate of 10° C./minute in order to avoid hysteresis effects. Relatively large quantities of samples were used in the DSC sample pans in order to detect an observable Tg. The baseline of DSC was calibrated using a standard method known in the art and the temperature range was calibrated using Indium as the standard sample.

Thermal Mechanical Analysis (TMA) was used to evaluate the glass transition temperatures (Tg) and coefficients of thermal expansion (CTEs) of the 6FDA-based polyimide films of the present invention. The temperature of TMA was calibrated using standard Indium samples under the penetration mode according to the standard procedure known in the art. The force and measurement length range were also calibrated by known methods in the art. In order to precisely measure the Tgs and the CTEs, the polyimide films, having thicknesses from about 10 μm to about 30 μm and a 22 millimeter fixed width were heated to 300° C. under nitrogen with a 1.0 MPa annealing stress (0.5 and 1.5 MPa were also used) and held at this temperature for 20 minutes. After cooling to 30° C., the polyimide films were subjected to different stresses with a heating rate of 10° C./minute. The Tg was taken as the temperature at the point of change in slope of dimensional change versus temperature. The Tgs obtained at each stress level were then extrapolated to zero stress. The CTE value was taken as the mean of the dimensional change between 50° C. and 150° C. The CTEs obtained at each stress level were then extrapolated to zero stress.

TABLE II

CTEs and Tgs of 6FDA-based polyimide films

| Diamine | 2,2'-Disubstituted Groups | CTE (×10$^{-6}$/° C.) | Tg (° C.) (TMA) | Tg (° C.) (DSC) |
|---|---|---|---|---|
| DCB | —Cl | 35.3 | 336 | 362 |
| DMB | —CH$_3$ | 39.1 | 325 | 355 |
| DCN | —CN | 38.3 | 331 | 357 |
| DBB | —Br | 37.5 | 329 | 353 |
| DIB | —I | 39.0 | 319 | 350 |
| PFMB | —CF$_3$ | 42.2 | 315 | 341 |
| MPPBZ | (p-CF$_3$-phenyl) | 49.3 | 286 | 299 |
| O6FDPBZ | (o-CF$_3$-phenyl) | 50.3 | 289 | 307 |
| M6FDPBZ | (m-CF$_3$-phenyl) | 52.2 | 278 | 288 |
| P6FDPBZ | (p-CF$_3$-phenyl) | 51.0 | 283 | 292 |
| 3PBZ | (biphenyl) | 53.2 | 285 | 287 |
| M12FDPBZ | (3,5-bis(CF$_3$)phenyl) | 54.1 | 263 | 282 |

As shown in Table II, above, the coefficients of thermal expansion (CTEs) for the 6FDA-based polyimide films comprising the polymerization product of 6FDA and 4,4'-diamino-2,2'-disubstituted biphenyl selected from one of 4,4'-diamino-2,2'-bis(trifluoromethyl)biphenyl (PFMB), 4,4'-diamino-2,2'-bis(p-trifluorometheylphenyl)-biphenyl (P6FDPBZ), 4,4'-diamino-2,2'-bis(o-trifluoromethylphenyl)-biphenyl (O6FDPBZ), 4,4'-diamino-2,2'-bis(m-trifluoromethylphenyl) biphenyl (M6FDPBZ) and 4,4'-diamino-2,2'bis[3,5-bis(trifluoromethyl)phenyl] biphenyl (M12FDPBZ) are from about and 42.4×10–6/° C. to about 54.1×10–6/° C. The 6FDA-based polyimide films comprising the polymerization product of 6FDA and a 4,4'-diamino-2,2'-disubstituted biphenyl having one of the 2'2-disubstituted groups trifluoromethyl and trifluoromethyl substituted phenyl at papa-, meta- and ortho-positions, exhibit improved CTEs and lower Tgs in comparison to those 6FDA-based polyimide films comprising the polymerization product of 6FDA and a 4,4'-diamino-2,2'-disubstituted biphenyls without a fluorine-containing substituent at the 2,2' positions of the diamine, which are from about 35.5×10–6/° C. to about 39.0×10–6/° C.

The glass transition temperatures (Tgs) for the 6FDA-based polyimide films comprising the polymerization product of 6FDA and a 4,4'-diamino-2,2'-disubstituted biphenyl selected from one of 4,4'-diamino-2,2'-bis(trifluoromethyl) biphenyl (PFMB), 4,4'-diamino-2,2'-bis(p-trifluorometheylphenyl)-biphenyl (P6FDPBZ), 4,4'-diamino-2,2'-bis(o-trifluoromethylphenyl)-biphenyl (P6FDPBZ), 4,4'-diamino-2,2'-bis(m-trifluoromethylphenyl) biphenyl (M6FDPBZ) and 4,4'-diamino-2,2'bis[3,5-bis(trifluoromethyl)phenyl] biphenyl (M12FDPBZ) were determined by the TMA and DSC methods. As shown in Table II, above, the glass transition temperatures (Tgs) for the 6FDA-based polyimide films comprising the polymerization product of 6FDA and a 4,4'-diamino-2,2'-disubstituted biphenyl selected from one of 4,4'-diamino-2,2'-bis(trifluoromethyl)biphenyl (PFMB), 4,4'-diamino-2,2'-bis(p-trifluorometheylphenyl)biphenyl (P6FDPBZ), 4,4'-diamino-2,2'-bis(o-trifluoromethylphenyl)-biphenyl (O6FDPBZ), 4,4'-diamino-2,2'-bis(m-trifluoromethylphenyl) biphenyl (M6FDPBZ) and 4,4'-diamino-2,2'bis[3,5-bis(trifluoromethyl)phenyl] biphenyl (M12FDPBZ), as determined by TMA, is in the range of about 263° C. to about 315° C., and as determined by DSC, is in the range of about 282° C. to about 341° C. The glass transition temperatures (Tgs) for the 6FDA-based polyimide films comprising the polymerization product of a 4,4'-diamino-2,2'-disubstituted biphenyl without a fluorine-containing substituent at the 2,2'-positions of the diamine, as determined by TMA, is in the range of about 319° C. to about 336° C., and as determined by DSC, is in the range of about 350° C. to about 362° C.

The polyimide films for the thermal stability were prepared as follows: solutions of 6FDA-based polyimides in cyclopentanone, DMAc (12% w/w), and/or m-cresol (5%) were filtered through 5 um Whatman Teflon syringe filters. The solutions were subsequently cast onto clear glass substrates. The thickness of the polyimide films was controlled using a doctor knife. The wet films were placed in an oven at 60° C. in order to slowly evaporate the solvent. After 24 hours, the samples were placed in a vacuum oven and dried at 180° C. for 48 hours. The film thicknesses could be control from 20 to 100 μm by this method. The resulting 6FDA-based polyimide films were used for Thermogravimetric Analysis (TGA).

The 6FDA-based polyimide films prepared for TGA measurements were heated to 300° C. and held for 20 minutes, followed by subsequent cooling to 30° C. prior to measurements. The polyimide films were then heated in nitrogen and air, using a heating rate of 10° C./minute and heated to 650° C. 2% and 5% weight loss temperature were used to evaluate the thermal and thermo-oxidative stability of the 6FDA-based polyimide films. The results of the thermal and thermo-oxidative experiments, as evaluated by TGA, are shown in Table III, below.

TABLE III

Temperatures for 2% and 5% weight loss in air and nitrogen for 6FDA-based polyimides

| Diamine | 2,2'-Disubstituted Groups | TGA (Air) (° C.) 2%/5% (wt) | TGA (N$_2$) (° C.) 2%/5% (wt) |
|---|---|---|---|
| DCB | —Cl | 458/497 | 486/513 |
| DMB | —CH$_3$ | 480/503 | 488/505 |
| DCN | —CN | 475/513 | 500/528 |
| DBB | —Br | 434/472 | 457/504 |
| DIB | —I | 341/413 | 375/467 |
| PFMB | —CF$_3$ | 490/518 | 505/530 |
| MPPBZ | —C$_6$H$_4$—CF$_3$ (para-CF$_3$ phenyl) | 425/471 | 440/480 |
| O6FDPBZ | o-CF$_3$ phenyl | 493/517 | 507/523 |
| M6FDPBZ | m-CF$_3$ phenyl | 488/508 | 506/525 |
| P6FDPBZ | p-CF$_3$ phenyl | 487/513 | 506/523 |
| 3PBZ | biphenyl | 485/513 | 501/521 |
| M12FDPBZ | 3,5-bis(CF$_3$)phenyl | 482/509 | 505/525 |

The onset temperatures of 2% and 5% weight losses for 6FDA-based polyimide films are shown in Table III, above. Onset temperatures of 2% and 5% weight losses in both atmospheres are used to represent the thermal and thermo-oxidative stability of aromatic polyimides. The results in Table III demonstrate that 6FDA-based polyimide films comprising the polymerization product of 6FDA and one of 4,4'-diamino-2,2'-bis(trifluoromethyl)biphenyl (PFMB), 4,4'-diamino-2,2'-bis(p-trifluorometheylphenyl)biphenyl (P6FDPBZ), 4,4'-diamino-2,2'-bis(o-trifluoromethylphenyl)-biphenyl (-6FDPBZ), 4,4'-diamino-2,2'-bis(m-trifluoromethylphenyl) biphenyl (M6FDPBZ) and 4,4'-diamino-2,2'bis[3,5-bis(trifluoromethyl)phenyl] biphenyl (M12FDPBZ) exhibit a 2% weight loss at 425° C. to 493° C. in air and a 2% weight loss in nitrogen at 440° C. to 507° C. The results further indicate that polyimides comprising the reaction product of 6FDA and one of 4,4'-diamino-2,2'-bis(trifluoromethyl)biphenyl (PFMB), 4,4'-diamino-2,2'-bis(p-trifluorometheylphenyl)-biphenyl (P6FDPBZ), 4,4'-diamino-2,2'-bis(o-trifluoromethylphenyl)-biphenyl (O6FDPBZ), 4,4'-diamino-2,2'-bis(m-trifluoromethylphenyl) biphenyl (M6FDPBZ) and 4,4'-diamino-2,2'bis[3,5-bis(trifluoromethyl)phenyl] biphenyl (M12FDPBZ) exhibit a 5% weight loss in air at 471° C. to 518° C., and a 5% weight loss in nitrogen at 480° C. to 530° C.

The Comparative results in Table III demonstrate that 6FDA-based polyimide films comprising the polymerization product and one of 4,4'-diamino-2,2'-dichlorobiphenyl (DCB, comparative), 4,4'-diamino-2,2'-dibromobiphenyl (DBB, comparative), 4,4'-diamino-2,2'-diiodobiphenyl (DIB, comparative), 4,4'-diamino-2,2'-dimethylbiphenyl (DMB, comparative), 4,4'-diamino-2,2'-dicyanobiphenyl (DCN, comparative), 4,4'-diamino-2,2'-bis(p-methylphenyl) biphenyl (MPPBZ, comparative), 4,4'-diamino-2,2'-bis(4-phenylphenyl)biphenyl (6FDA-3PBZ, comparative) experience a 2% weight loss at 341° C. to 480° C. in air and 2% weight loss in nitrogen at 375° C. to 50° C. The results in Table III further demonstrate that 6FDA-based polyimide films experience 5% weight loss at 413° C. to 503° C. in air and 5% weight loss at 467° C. to 528° C. in nitrogen.

Several solvents were used to determine the solubility of 6FDA-based aromatic polyimides at ambient temperature. The 6FDA-based polyimides were considered to be soluble if a solution of 5% (wt/wt) concentration could be prepared. The results of the solubility experiments are shown in Table IV, below.

TABLE IV

Solubility of 6FDA-based polyimides with different diamines

| Diamine | Acetone | Cyclo-pentanone | THF | DMAc | DMF | NMP |
|---|---|---|---|---|---|---|
| DCB | + | + | + | + | + | + |
| DMB | + | + | + | + | + | + |
| DCN | + | + | + | + | + | + |
| DBB | + | + | + | + | + | + |
| DIB | + | + | + | + | + | + |
| PFMB | + | + | + | + | + | + |
| MPPBZ | + | + | + | + | + | + |
| O6FDPBZ | + | + | + | + | + | + |
| M6FDPBZ | + | + | + | + | + | + |
| P6FDPBZ | + | + | + | + | + | + |
| 3PBZ | + | + | + | + | + | + |
| M12FDPBZ | + | + | + | + | + | + |

+ Minimum solubility more than 5% (wt)

It is well known that aromatic polyimides are insoluble in many conventional organic solvents, due to their highly conjugated, rigid-rod chemical structures, In order to employ a one-step polymerization methods for obtaining high molecular weight aromatic polyimides useful as coatings, layers or films for microelectronic applications, it is necessary to develop polyimides having a good solubility in organic solvents. As shown in Table IV above, the 6FDA-based aromatic polyimides are soluble in many conventional organic solvents, such as acetone, cyclopentanone, tetrahyofuran, dimethlacetamide (DMAc), N,N'-dimethyl formamide (DMF) and N-methylpyrrolidone (NMP).

Without being bound by any particular theory, the unexpected solubility of the 6FDA-based polyimides may be attributed partially to the incorporation of the twisted-biphenyl diamines. The non-coplanar diamine disrupt the chain packing, eliminate crystallinity and interrupt conjugations along the chain backbones. The resulting loose packing generates more free volume, which permit solvent molecules to penetrate into the polymer systems.

The dielectric constants for PFMB-based polyimide films was determined using ASTM-150 method at 1 MHz on polyimide films having a thickness of 10 to 40 microns. The results of the dielectric experiments for PFMB-based polyimides are shown in Table V, below.

The dielectric constants for PFMB-based polyimide films was determined using ASTM-150 method at 1 MHz on PFMB-based polyimide films having a thickness of 10 to 40 microns. The dielectric constants for PFMB-based polyimide films comprising the polymerization product of PFMB and one of 2,2'-bis(trifluoromethyl)-4,4',5,5'-biphenyltetracarboxylic dianhydride (PFMB-HFBPDA), 2,2'-bis[o-(trifluoromethyl)phenyl]-4,4',5,5'-biphenyltetracarboxylic dianhydride (PFMB-O6FDPBPDA), 2,2'-bis[m-(trifluoromethyl)phenyl]-4,4',5,5'-biphenyltetracarboxylic dianhydride (PFMB-M6FDPBPDA), 2,2'-bis[p-(trifluoromethyl)phenyl]-4,4',5,5'-biphenyltetracarboxylic dianhydride (PFMB-P6FDPBPDA) and 2,2'-bis[3,5-bis(trifluoromethyl)phenyl]-4,4',5,5'-biphenyltetracarboxylic dianhydride (PFMB-M12FDPBPDA). Comparative expereiments were also conducted to determine the dielectric constants for PFMB-based polyimide films comprising the polymerization product of PFMB and one of 2,2'-diphenyl-4,4',5,5'-biphenyltetracarboxylic dianhydride (PFMB-DPBPDA, comparative), 4,4',5,5'-biphenyltetracarboxylic dianhydride (PFMB-BPDA, comparative), 2,2'-dibromo-4,4',5,5'-biphenyltetracarboxylic dianhydride (PFMB-DBBPDA, comparative) were also determined. The results of the dielectric experiments for PFMB-based polyimides are shown in Table V, below.

TABLE V

Dielectric constants of PFMB-based aromatic polyimide films in the MHz and GHz frequency regions

| Dianhydride | 2,2'-Disubstituted Groups | $\epsilon = n^2$ | $\epsilon^a$ | F % |
|---|---|---|---|---|
| BPDA | none | 2.64 | 2.89 | 22.2 |
| DBBPDA | —Br | 2.60 | | |
| HFBPDA | —CF$_3$ | 2.37 | | |
| DPBPDA | phenyl | 2.59 | | |
| O6FDPBPDA | ortho-CF$_3$-phenyl | 2.46 | 2.68 | 26.3 |
| M6FDPBPDA | meta-CF$_3$-phenyl | 2.48 | 2.79 | 26.3 |
| P6FDPBPDA | para-CF$_3$-phenyl | 2.45 | 2.75 | 26.3 |
| M12FDPBPDA | 3,5-bis(CF$_3$)-phenyl | 2.37 | 2.45 | 34.1 |

[a] Determined using ASTM-150 method at 1 MHz on film with thickness of 10–40 μm As shown in Table V, above, the dielectric constants for PFMB-based polyimide films comprising the polymerization product of PFMB and one of 2,2'-bis(trifluoromethyl)-4,4',5,5'-biphenyltetracarboxylic dianhydride (PFMB-HFBPDA), 2,2'-bis[o-(trifluoromethyl)phenyl]-4,4',5,5'-biphenyltetracarboxylic dianhydride (PFMB-O6FDPBPDA), 2,2'-bis[m-(trifluoromethyl)phenyl]-4,4',5,5'-biphenyltetracarboxylic dianhydride (PFMB-M6FDPBPDA), 2,2'-bis-[p-(trifluoromethyl)phenyl]-4,4',5,5'-biphenyltetracarboxylic dianhydride (PFMB-P6FDPBPDA) and 2,2'-bis[3,5-bis(trifluoromethyl)phenyl]-4,4',5,5'-biphenyltetracarboxylic dianhydride (PFMB-M12FDPBPDA) exhibit low dielectric constants, namely less than 2.8. The PFMB based polyimide films comprising the polymerization product of PFMB and one of 2,2'-diphenyl-4,4',5,5'-biphenyltetracarboxylic dianhydride (PFMB-DPBPDA, comparative), 4,4',5,5'-biphenyltetracarboxylic dianhydride (PFMB-BPDA, comparative), 2,2'-dibromo-4,4',5,5'-biphenyltetracarboxylic dianhydride (PFMB-DBBPDA, comparative) exhibit higher dielectric constants, namely greater than 2.8. The results Table V indicate that the PFMB-based polyimide films comprising the polymerization product of PFMB and one of 2,2'-bis(trifluoromethyl)-4,4',5,5'-biphenyltetracarboxylic dianhydride (PFMB-HFBPDA), 2,2'-bis[o-(trifluoromethyl)phenyl-4,4',5,5'-biphenyltetracarboxylic dianhydride (PFMB-O6FDPBPDA), 2,2'-bis[m-(trifluoromethyl)phenyl]-4,4',5,5'-biphenyltetracarboxylic dianhydride (PFMB-M6FDPBPDA), 2,2'-bis[p-(trifluoromethyl)phenyl]-4,4',5,5'-biphenyltetracarboxylic dianhydride (PFMB-P6FDPBPDA) and 2,2'-bis[3,5-bis(trifluoromethyl)phenyl]-4,4',5,5'-biphenyltetracarboxylic dianhydride (PFMB-M12FDPBPDA) exhibit lower dielectric constants in comparison to those PFMB based polyimide films comprising 2,2'-disubstituted-4,4'5,5'-biphenyltetracarboxylic dianhydrides without fluorinated substituents at the 2,2' positions.

The thermal expansion and glass transition temperatures for PFMB-based polyimide films was determined by using the Thermal Mechanical Analysis (TMA) and Differential Scanning Calorimetry (DSC) methods. A non-fluorine substituent-containing diamine (DMB) was also polymerized to the same 2,2'-disubstituted-4,4'5,5'-biphenyltetracarboxylic dianhydrides as was the diamine PFMB. The coefficient of thermal expansion (CTE) and glass transition temperatures (Tgs) for the PFMB-based and DMB-based polyimide films are shown in Table VI, below.

The glass transition temperatures (Tg) of the PFMB-based and DMB-based polyimide films of the present invention comprising the polymerization product of PFMB or DMB and one of 2,2'-bis(trifluoromethyl)-4,4',5,5'-biphenyltetracarboxylic dianhydride (HFBPDA), 2,2'-bis[o-(trifluoromethyl)phenyl]-4,4',5,5'-biphenyltetracarboxylic dianhydride ((O6FDPBPDA)), 2,2'-bis[m-(trifluoromethyl)phenyl]-4,4',5,5'-biphenyltetracarboxylic dianhydride (M6FDPBPDA), 2,2'-bis p-(trifluoromethyl)phenyl]-4,4',5,5'-biphenyltetracarboxylic dianhydride (P6FDPBPDA) and 2,2'-bis[3,5-bis(trifluoromethyl)phenyl]-4,4',5,5'-biphenyltetracarboxylic dianhydride (M12FDPBPDA). Comparative experiments were also conducted to determine the glass transition temperatures (Tgs)for PFMB-based and DMB-based polyimide films comprising the polymerization product of PFMB or DMB and one of 2,2'-diphenyl-4,4',5,5'-biphenyltetracarboxylic dianhydride (DPBPDA, comparative), 4,4',5,5'-biphenyltetracarboxylic dianhydride (BPDA, comparative), 2,2'-dibromo-4,4',5,5'-biphenyltetracarboxylic dianhydride (DBBPDA), comparativewere evaluated. Thermal Mechanical Analysis (TMA) was used to evaluate the glass transition temperatures (Tg) and coefficients of thermal expansion (CTEs) of the PFMB-based and DMB-based polyimide films of the present invention. The temperature of TMA was calibrated using standard Indium samples under the penetration mode according to the standard procedure known in the art. The force and measurement length range were also calibrated by known methods in the art. In order to precisely measure the Tgs and the CTEs, the polyimide films, having thicknesses from about 10 µm to about 30 µm and a 22 millimeter fixed width were heated to 300° C. under nitrogen with a 1.0 MPa annealing stress (0.5 and 1.5 MPa were also used) and held at this temperature for 20 minutes. After cooling to 30° C., the polyimide films were subjected to different stresses with a heating rate of 10° C./minute. The Tg was taken as the temperature at the point of change in slope of dimensional change versus temperature. The Tgs obtained at each stress level were then extrapolated to zero stress. The CTE value was taken as the mean of the dimensional change between 50° C. and 150° C. The CTEs obtained at each stress level were then extrapolated to zero stress.

The thermal expansion and glass transition temperatures for PFMB-based and DMB-based polyimide films was determined by using the TMA method. The coefficients of thermal expansion (CTEs) and glass transition temperatures (Tgs) for the PFMB-based and DMB-based polyimide films are shown in Table VI, below.

TABLE VI

CTEs and Tgs for PFMB-based and DMB-based polyimide films

| Dianhydride | 2,2'-Disubstituted Groups | CTE ($\times 10^{-6}$/° C.) (PFMB-) | Tg (° C.) (PFMB-) | CTE ($\times 10^{-6}$/° C.) (DMB-) | Tg (° C.) (DMB-) |
|---|---|---|---|---|---|
| BPDA | none | 7.06 | 304 | 1.26 | 334 |
| DBBPDA | —Br | 13.4 | 330 | 10.5 | 337 |
| HFBPDA | —$CF_3$ | 23.2 | 332 | 18.5 | 345 |
| DPBPDA | —phenyl | 25.8 | 346 | 24.9 | 364 |
| O6FDPBPDA | —(o-$CF_3$-phenyl) | 32.0 | 372 | 26.5 | 369 |
| M6FDPBPDA | —(m-$CF_3$-phenyl) | 32.7 | 342 | 30.6 | 346 |
| P6FDPBPDA | —(p-$CF_3$-phenyl) | 34.5 | 356 | 33.3 | 367 |

TABLE VI-continued

CTEs and Tgs for PFMB-based and DMB-based polyimide films

| Dianhydride | 2,2'-Disubstituted Groups | CTE (×10⁻⁶/° C.) (PFMB-) | Tg (° C.) (PFMB-) | CTE (×10⁻⁶/° C.) (DMB-) | Tg (° C.) (DMB-) |
|---|---|---|---|---|---|
| M12FDPBPDA | 3,5-bis(CF₃)phenyl | 38.3 | 339 | 36.9 | 342 |

As shown in Table VI, above, the coefficient of thermal expansion (CTE) for the PFMB-based polyimide films comprising the polymerization product of PFMB and one of 2,2'-bis(trifluoromethyl)-4,4',5,5'-biphenyltetracarboxylic dianhydride (HFBPDA), 2,2'-bis[o-(trifluoromethyl)phenyl]-4,4',5,5'-biphenyltetracarboxylic dianhydride (O6FDPBPDA), 2,2'-bis[m-(trifluoromethyl)phenyl]-4,4',5,5'-biphenyltetracarboxylic dianhydride (M6FDPBPDA), 2,2'-bis[p-(trifluoromethyl)phenyl]-4,4',5,5'-biphenyltetracarboxylic dianhydride (P6FDPBPDA) and 2,2'-bis[3,5-bis(trifluoromethyl)phenyl]-4,4',5,5'-biphenyltetracarboxylic dianhydride (M12FDPBPDA) are in the range of about $23.2 \times 10^{-6}$/° C. to about $38.3 \times 10^{-6}$/° C., while the coefficient of thermal expansion (CTE) for the PFMB-based polyimide films comprising the polymerization product of PFMB and one of 2,2'-diphenyl-4,4',5,5'-biphenyltetracarboxylic dianhydride (DPBPDA, comparative), 4,4',5,5'-biphenyltetracarboxylic dianhydride (BPDA, comparative), 2,2'-dibromo-4,4',5,5'-biphenyltetracarboxylic dianhydride (DBBPDA), are in the range of about $7.06 \times 10^{-6}$/° C. to about $25.8 \times 10^{-6}$/° C.

The coefficient of thermal expansion (CTE) for the DMB-based polyimide films comprising the polymerization product of DMB and one of 2,2'-bis(trifluoromethyl)-4,4',5,5'-biphenyltetracarboxylic dianhydride (HFBPDA), 2,2'-bis[o-(trifluoromethyl)phenyl]-4,4',5,5'-biphenyltetracarboxylic dianhydride ((O6FDPBPDA)), 2,2'-bis[m-(trifluoromethyl)phenyl]-4,4',5,5'-biphenyltetracarboxylic dianhydride (M6FDPBPDA), 2,2'-bis[p-(trifluoromethyl)phenyl]-4,4',5,5'-biphenyltetracarboxylic dianhydride (P6FDPBPDA) and 2,2'-bis[3,5-bis(trifluoromethyl)phenyl]-4,4',5,5'-biphenyltetracarboxylic dianhydride (M12FDPBPDA) are in the range of about $18.5 \times 10^{-6}$/° C. to about $36.9 \times 10^{-6}$/° C., while the coefficient of thermal expansion (CTE) for the DMB-based polyimide films comprising the polymerization product of DMB and one of 2,2'-diphenyl-4,4',5,5'-biphenyltetracarboxylic dianhydride (DPBPDA, comparative), 4,4',5,5'-biphenyltetracarboxylic dianhydride (BPDA, comparative), 2,2'-dibromo-4,4',5,5'-biphenyltetracarboxylic dianhydride (DBBPDA), are in the range of about $1.26 \times 10^{-6}$/° C. to about $24.9 \times 10^{-6}$/° C.

The glass transition temperature (Tg) PFMB-based polyimide films comprising the polymerization product of PFMB and one of 2,2'-bis(trifluoromethyl)4,4',5,5'-biphenyltetracarboxylic dianhydride (HFBPDA), 2,2'-bis[o-(trifluoromethyl)phenyl]-4,4',5,5'-biphenyltetracarboxylic dianhydride (O6FDPBPDA), 2,2'-bis[m-(trifluoromethyl)phenyl]-4,4',5,5'-biphenyltetracarboxylic dianhydride (M6FDPBPDA), 2,2'-bis[p-(trifluoromethyl)phenyl]-4,4',5,5'-biphenyltetracarboxylic dianhydride (P6FDPBPDA) and 2,2'-bis[3,5-bis(trifluoromethyl)phenyl]-4,4',5,5'-biphenyltetracarboxylic dianhydride (M12FDPBPDA) are in the range of about 332° C. to about 372° C., while the glass transition temperature (Tg) for the PFMB-based polyimide films comprising the polymerization product of PFMB and one of 2,2'-diphenyl-4,4',5,5'-biphenyltetracarboxylic dianhydride (DPBPDA, comparative), 4,4',5,5'-biphenyltetracarboxylic dianhydride (BPDA, comparative), 2,2'-dibromo-4,4',5,5'-biphenyltetracarboxylic dianhydride (DBBPDA), are in the range of about 304° C. to about 346° C.

The glass transition temperature (Tg) for the DMB-based polyimide films comprising the polymerization product of DMB and one of 2,2'-bis(trifluoromethyl)-4,4',5,5'-biphenyltetracarboxylic dianhydride (HFBPDA), 2,2'-bis[o-(trifluoromethyl)phenyl]-4,4',5,5'-biphenyltetracarboxylic dianhydride (O6FDPBPDA), 2,2'-bis[m-(trifluoromethyl)phenyl]4,4',5,5'-biphenyltetracarboxylic dianhydride (M6FDPBPDA), 2,2'-bis[p-(trifluoromethyl)phenyl]-4,4',5,5'-biphenyltetracarboxylic dianhydride (P6FDPBPDA) and 2,2'-bis[3,5-bis(trifluoromethyl)phenyl]-4,4',5,5'-biphenyltetracarboxylic dianhydride (M12FDPBPDA) are in the range of about 345° C. to about 369° C., while the glass transition temperature (Tg) for the DMB-based polyimide films comprising the polymerization product of DMB and one of 2,2'-diphenyl-4,4',5,5'-biphenyltetracarboxylic dianhydride (DPBPDA, comparative), 4,4',5,5'-biphenyltetracarboxylic dianhydride (BPDA, comparative), 2,2'-dibromo-4,4',5,5'-biphenyltetracarboxylic dianhydride (DBBPDA), are in the range of about 334° C. to about 364° C.

The thermal and thermo-oxidative stability of PFMB-based aromatic polyimide films was evaluated by nonisothermal TGA experiments under dry nitrogen and air. The results of the thermal and thermo-oxidative experiments are shown in Table VII, below.

TABLE VII

Temperatures for 2% and 5% weight loss in air and nitrogen for PFMB-based polyimides

| Dianhydride | 2,2'-Disubstituted Groups | TGA (Air) (° C.) 2%/5% (wt) | TGA (N₂) (° C.) 2%/5% (wt) |
|---|---|---|---|
| BPDA | none | 531/564 | 530/565 |
| DBBPDA | —Br | 486/518 | 492/523 |
| HFBPDA | —CF₃ | 530/549 | 537/566 |
| DPBPDA | phenyl | 498/539 | 513/542 |

TABLE VII-continued

Temperatures for 2% and 5% weight loss in air and nitrogen for PFMB-based polyimides

| Dianhydride | 2,2'-Disubstituted Groups | TGA (Air) (° C.) 2%/5% (wt) | TGA (N$_2$) (° C.) 2%/5% (wt) |
|---|---|---|---|
| O6FDPBPDA | 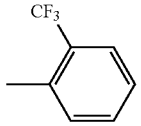 | 529/553 | 531/559 |
| M6FDPBPDA | 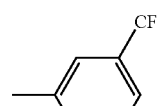 | 529/563 | 536/566 |
| P6FDPBPDA | 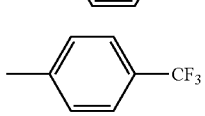 | 524/546 | 534/555 |
| M12FDPBPDA | 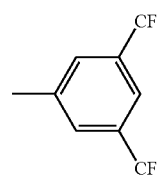 | 530/550 | 535/565 |

The onset temperatures of 2% and 5% weight losses for PFMB-based polyimide films comprising the polymerization product of PFMB and one of 2,2'-bis(trifluoromethyl)-4,4',5,5'-biphenyltetracarboxylic dianhydride (PFMB-HFBPDA), 2,2'-bis[o-(trifluoromethyl)phenyl]-4,4',5,5'-biphenyltetracarboxylic dianhydride (PFMB-O6FDPBPDA), 2,2'-bis[m-(trifluoromethyl)phenyl]-4,4',5,5'-biphenyltetracarboxylic dianhydride (PFMB-M6FDPBPDA), 2,2'-bis[p-(trifluoromethyl)phenyl]-4,4',5,5'-biphenyltetracarboxylic dianhydride (PFMB-P6FDPBPDA) and 2,2'-bis[3,5-bis(trifluoromethyl)phenyl]-4,4',5,5'-biphenyltetracarboxylic dianhydride (PFMB-M12FDPBPDA). Comparative expereiments were also conducted to determine the dielectric constants for PFMB-based polyimide films comprising the polymerization product of PFMB and one of 2,2'-diphenyl-4,4',5,5'-biphenyltetracarboxylic dianhydride (PFMB-DPBPDA, comparative), 4,4',5,5'-biphenyltetracarboxylic dianhydride (PFMB-BPDA, comparative), 2,2'-dibromo-4,4',5,5'-biphenyltetracarboxylic dianhydride (PFMB-DBBPDA, comparative) are shown in Table VII, above. Onset temperatures of 2% and 5% weight losses in both atmospheres are used to represent the thermal and thermo-oxidative stability of aromatic polyimides. The results in Table VII demonstrate that PFMB-based polyimide films comprising the polymerization product of PFMB and one of 2,2'-bis(trifluoromethyl)-4,4',5,5'-biphenyltetracarboxylic dianhydride (HFBPDA), 2,2'-bis[o-(trifluoromethyl)phenyl]-4,4',5,5'-biphenyltetracarboxylic dianhydride (O6FDPBPDA), 2,2'-bis[m-(trifluoromethyl)phenyl]-4,4',5,5'-biphenyltetracarboxylic dianhydride (M6FDPBPDA), 2,2'-bis[p-(trifluoromethyl)phenyl]-4,4',5,5'-biphenyltetracarboxylic dianhydride (P6FDPBPDA) and 2,2'-bis[3,5-bis(trifluoromethyl)phenyl]-4,4',5,5'-biphenyltetracarboxylic dianhydride (M12FDPBPDA) experience a 2% weight loss weight loss at about 524° C. to 530° C. in air, and at about 531° C. to about 537° C. in nitrogen, respectively. These compounds experience a 5% weight loss at 549° C. to 563° C. in air, and at about 555° C. to about 566° C. in nitrogen. The results further show that PFMB-based polyimide films comprising the polymerization product of PFMB and one of 2,2'-diphenyl-4,4',5,5'-biphenyltetracarboxylic dianhydride (DPBPDA, comparative), 4,4',5,5'-biphenyltetracarboxylic dianhydride (BPDA, comparative), 2,2'-dibromo-4,4',5,5'-biphenyltetracarboxylic dianhydride (DBBPDA, comparative) experience a 2% weight loss weight loss at about 486° C. to 531° C. in air, and at about 492° C. to about 530° C. in nitrogen, respectively. These polyimides exhibit a 5% weight loss at about 518° C. to about 564° C. in air, and at about −542° C. to 556° C.

Several solvents were used to determine the solubility of PFMB-based aromatic polyimides at ambient temperature. These polyimides are prepared by the 2,2'-disubsitution groups on 4,4',5,5'-biphenyltetracarboxylic dianhydrides in polyimide backbones. The polyimides were considered to be soluble if a solution of 5% (wt/wt) concentration could be prepared. The results of the solubility experiments are shown in Table VIII, below.

TABLE VIII

Solubility of PFMB-based polyimides with different dianhydrides

| Dianhydride | Acetone | Cyclo-pentanone | THF | NMP | m-cresol | p-chloro phenol |
|---|---|---|---|---|---|---|
| BPDA | − | − | − | − | + | + |
| DBBPDA | + | + | + | + | + | + |
| HFBPDA | + | + | + | + | + | + |
| DPBPDA | + | + | + | + | + | + |
| O6FDPBPDA | + | + | + | + | + | + |
| M6FDPBPDA | + | + | + | + | + | + |
| P6FDPBPDA | + | + | + | + | + | + |
| M12FDPBPDA | + | + | + | + | + | + |

+ Minimum solubility more than 5% (wt)
− Maximum solubility less than 2% (wt)

As shown in Table VIII above, the PFMB-based aromatic polyimides are soluble in many conventional organic solvents, such as acetone, cyclopentanone, tetrahyofuran, N-methylpyrrolidone (NMP), m-cresol and p-chlorophenol. The experimental results shown in Table VIII demonstrate, with the exception of BPDA-PFMB which contains the 4,4',5,5'-bipohenyltetracarboxylic dianhydride (BPDA) without disubstituted groups at the 2,2'-positions, that the solubility of the resulting polyimides can be improved through the use of 2,2'-disubstituted-4,4',5,5'-biphenyltetracarboxylic dianhydrides in polyimide backbones.

Several solvents were used to determine the solubility of DMB-based aromatic polyimides at ambient temperature. These polyimides are prepared by the 2,2'-disubsitution of pendant groups on 4,4',5,5'-biphenyltetracarboxylic dianhydrides in polyimide backbones. The polyimides were considered to be soluble if a solution of 5% (wt/wt) concentration could be prepared. The results of the solubility experiments are shown in Table IX, below.

TABLE IX

Solubility of DMB-based polyimides with different dianhydrides

| Dianhydride | Acetone | Cyclo-pentanone | THF | NMP | m-cresol | p-chloro phenol |
|---|---|---|---|---|---|---|
| BPDA | − | − | − | − | − | + |
| DBBPDA | − | + | + | + | + | + |
| HFBPDA | − | − | + | + | + | + |
| DPBPDA | − | − | + | + | + | + |
| O6FDPBPDA | − | − | + | + | + | + |
| M6FDPBPDA | − | − | + | + | + | + |
| P6FDPBPDA | − | − | + | + | + | + |
| M12FDPBPDA | + | − | + | + | + | + |

+ Minimum solubility more than 5% (wt)
− Maximum solubility less than 2% (wt)

As shown in Table IX above, the DMB-based aromatic polyimide BPDA-DMB is only soluble in p-chlorophenol. The DMB-based polyimide M12FDPBPDA-DMB is soluble in soluble in many conventional organic solvents, such as acetone, cyclopentanone, tetrahyofuran, N-methylpyrrolidone (NMP), m-cresol and p-chlorophenol The DMB-based polyimides DBBPDA-DMB, HFBPDA-DMB DPBPDA-DMB, (O6FDPBPDA)-DMB, M6FDPBPDA-DMB and P6FDPBPDA are not soluble in acetone, but are soluble in cyclopentanone, tetrahyofuran, N-methylpyrrolidone (NMP), m-cresol and p-chlorophenol The experimental results shown in Table IX demonstrate, with the exception of BPDA-DMB which contains the 4,4',5,5'-bipohenyltetracarboxylic dianhydride (BPDA) without disubstituted groups at the 2,2'-positions, that the solubility of the resulting polyimides can be improved through the use of 2,2'-disubstituted-4,4',5,5'-biphenyltetracarboxylic dianhydrides in polyimide.

The polyimide coatings of this invention have excellent dielectric constants, coefficients of Thermal expansion, and thermal stability. Additionally, the polyimides used in this invention are advantageously soluble in common organic solvents and, therefore, are easily processed and used for Insulating electronic and microelectronic components.

Based on the foregoing disclosure, it is therefore demonstrated that the objects of the present invention are accomplished by the polyimide coating compositions and coated integrated circuit chips described herein. It should be understood that the selection of specific organic substituents (i.e. —R groups) of the aromatic dianhydrides and aromatic diamines, polymerization techniques, polymerization conditions, and methods of coating integrated circuit chips can be determined by one having ordinary skill in the art without departing from the spirit of the invention herein disclosed and described. It should therefore be appreciated that the present invention is not limited to the specific embodiments described above, but includes variations, modifications and equivalent embodiments defined by the following claims.

We claim:

1. An insulated integrated circuit comprising:
an integrated circuit; and
an insulating layer having a dielectric constant of less than about 2.5 is disposed on said integrated circuit, wherein said insulating layer is a polyimide film that is the polymerization product of an aromatic diamine having the general formula (I):

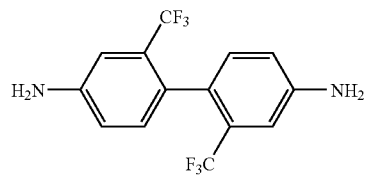

and an aromatic dianhydride having the formula (II):

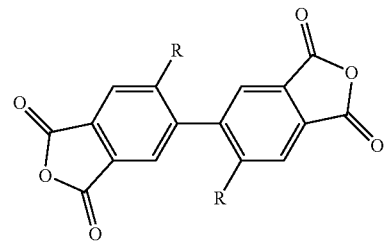

wherein R is an organic substituent selected from the group consisting of $CF_3$, o-trifluoromethyl phenyl, m-trifluoromethyl phenyl, p-trifluoromethyl phenyl and 3,5 bis[(m-trifluoromethyl) phenyl]; or
the polymerization product of an aromatic dianhydride having the general formula (III):

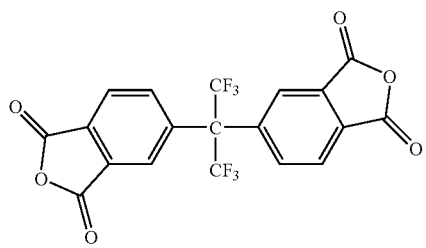

and an aromatic diamine having the formula (IV):

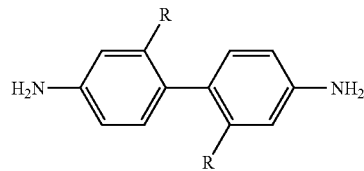

wherein R is a substituent selected from the group consisting of trifluoromethyl, o-trifluoromethyl phenyl, m-trifluoromethyl phenyl, p-trifluoromethyl phenyl and 3,5'-bis[(m-trifluoromethyl) phenyl].

2. The insulated integrated circuit according to claim 1, wherein said integrated circuit is a microprocessor.

3. The insulated integrated circuit according to claim 1, wherein the thickness of said insulating layer is from about 10 to about 1000 microns.

4. The insulated integrated circuit according to claim 1, wherein the thickness of said insulating layer is from about 10 to about 500 microns.

5. The insulated integrated circuit according to claim 1, wherein the thickness of said insulating layer is from about 10 to about 100 microns.

6. The insulated integrated circuit according to claim 1, wherein the coefficient of thermal expansion is greater than about $23 \times 10^{-6}/°C$.

7. The insulated integrated circuit according to claim 1, wherein the coefficient of thermal expansion is greater than about $42 \times 10^{-6}/°$ C.

8. The insulated integrated circuit according to claim 1, wherein the coefficient of thermal expansion is greater than about $50 \times 10^{-6}/°$ C.

9. An insulated electrically conductive component comprising:
an electrically conductive component; and
an insulating layer comprising the polymerization product of an aromatic diamine having the general formula (I):

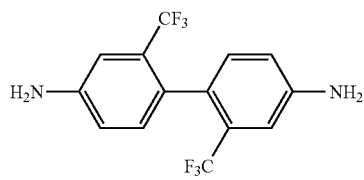

and an aromatic dianhydride having the formula (II):

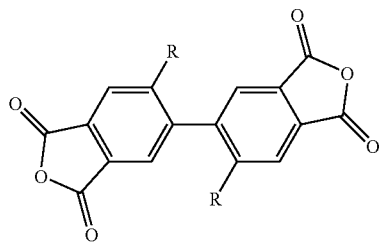

wherein R is an organic substituent selected from the group consisting of CF$_3$, O-trifluoromethyl phenyl, m-trifluoromethyl phenyl, p-trifluoromethyl phenyl and 3,5-bis[(m-trifluoromethyl) phenyl]; or
the polymerization product of an aromatic dianhydride having the general formula (III):

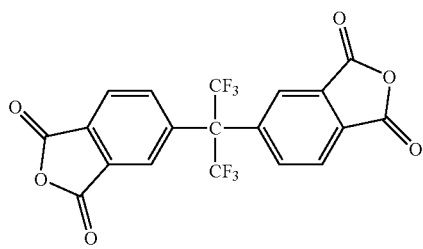

and an aromatic diamine having the formula (IV):

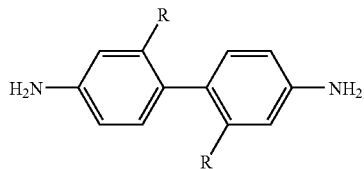

wherein R is a substituent selected from the group consisting of trifluoromethyl, o-trifluoromethyl phenyl, m-trifluoromethyl phenyl, p-trifluoromethyl phenyl and 3,5'-bis[(m-trifluoromethyl) phenyl], and wherein the coefficient of thermal expansion of the insulated electrically conductive component is greater than about $23 \times 10^{-6}/°$ C.

10. The insulated electrically conductive component according to claim 9, wherein said electrically conductive component is selected from the group consisting of capacitors, diodes, connectors and transistors.

11. The insulated electrically conductive component according to claim 9, wherein the thickness of said insulating layer is from about 10 to about 1000 microns.

12. The insulated electrically conductive component according to claim 9, wherein the thickness of said insulating layer is from about 10 to about 500 microns.

13. The insulated electrically conductive component according to claim 9, wherein the thickness of said insulating layer is from about 10 to about 100 microns.

14. The Insulated electrically conductive component according to claim 9, wherein the dielectric constant of said insulating layer is less than about 2.8.

15. The insulated electrically conductive component according to claim 9, wherein the dielectric constant of said insulating layer is less than about 2.7.

16. The insulated electrically conductive component according to claim 9, wherein the dielectric constant of said insulating layer is less than about 2.5.

17. The insulated electrically conductive component according to claim 9, wherein the coefficient of thermal expansion is greater than about $42 \times 10^{-6}/°$ C.

18. The insulated electrically conductive component according to claim 1, wherein the coefficient of thermal expansion is greater than about $50 \times 10^{-6}/°$ C.

* * * * *